United States Patent
Hoang et al.

(10) Patent No.: US 10,650,868 B2
(45) Date of Patent: May 12, 2020

(54) SELF-TRACKING SENSING AMPLIFICATION CIRCUIT

(71) Applicant: eMemory Technology Inc., Hsin-Chu (TW)

(72) Inventors: Dung Le Tan Hoang, Hsinchu County (TW); Hao-Chun Hu, Hsinchu County (TW); Po-Hao Huang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 16/281,099

(22) Filed: Feb. 21, 2019

(65) Prior Publication Data
US 2019/0325923 A1    Oct. 24, 2019

Related U.S. Application Data

(60) Provisional application No. 62/659,150, filed on Apr. 18, 2018.

(51) Int. Cl.
| | | |
|---|---|---|
| G11C 7/08 | (2006.01) |
| G11C 7/06 | (2006.01) |
| G11C 7/12 | (2006.01) |
| G11C 5/14 | (2006.01) |
| G11C 17/16 | (2006.01) |
| G11C 17/18 | (2006.01) |

(Continued)

(52) U.S. Cl.
CPC .............. *G11C 7/065* (2013.01); *G11C 5/147* (2013.01); *G11C 7/08* (2013.01); *G11C 7/12* (2013.01); *G11C 17/16* (2013.01); *G11C 17/18* (2013.01); *H01L 27/11517* (2013.01); *H01L 29/40114* (2019.08); *H01L 29/40117* (2019.08)

(58) Field of Classification Search
CPC .. G11C 7/06; G11C 7/08; G11C 7/062; G11C 16/26; G11C 16/28; G11C 16/22
USPC ....................... 365/185.21, 189.15, 205, 207
See application file for complete search history.

(56) References Cited

U.S. PATENT DOCUMENTS

| | | |
|---|---|---|
| 5,479,374 A | 12/1995 | Kobayashi |
| 6,862,208 B2 | 3/2005 | Palmer |
| 9,881,687 B2 | 1/2018 | Qiu |

(Continued)

FOREIGN PATENT DOCUMENTS

| | | |
|---|---|---|
| KR | 10-1060037 B1 | 8/2011 |
| TW | 200707451 | 2/2007 |
| TW | 201101326 A1 | 1/2011 |

*Primary Examiner* — Alfredo Bermudez Lozada
(74) *Attorney, Agent, or Firm* — Winston Hsu

(57) ABSTRACT

A sensing amplification circuit includes a sensing amplifier and a trigger control circuit. The sensing amplifier receives a data voltage and a reference voltage, and outputs a first data signal and a second data signal by comparing the data voltage and the reference voltage. The trigger control circuit includes a logic circuit and a set-reset latch. The logic circuit receives the first data signal and the second data signal, and changes a first control signal from a first voltage level to a second voltage level when one of the first data signal and the second data signal changes its state. The first set-reset latch receives the first control signal and a second control signal, and generates a trigger signal to enable the sensing amplifier when the second control signal changes state and disable the sensing amplifier when the first control signal changes state.

14 Claims, 3 Drawing Sheets

(51) Int. Cl.
*H01L 21/28* (2006.01)
*H01L 27/11517* (2017.01)

(56) References Cited

U.S. PATENT DOCUMENTS

2014/0204660 A1   7/2014  Chandwani
2017/0178742 A1*  6/2017  Qiu ........................ G11C 17/18

* cited by examiner

SELF-TRACKING SENSING AMPLIFICATION CIRCUIT

CROSS REFERENCE TO RELATED APPLICATIONS

This non-provisional application claims priority of U.S. provisional application No. 62/659,150, filed on Apr. 18, 2018, included herein by reference in its entirety.

BACKGROUND OF THE INVENTION

1. Field of the Invention

The present invention is related to a sensing amplification circuit, and more particularly, to a self-tracking sensing amplification circuit.

2. Description of the Prior Art

In a memory system, to identify the value of the data stored in a memory cell, a sensing amplifier is often used to compare the data voltage generated by the memory cell with a reference voltage. For example, if the data voltage is higher than the reference voltage, the sensing amplifier will output a high voltage level indicating the value of the data stored in the memory cell to be "0". Otherwise, if the data voltage is lower than the reference voltage, the sensing amplifier will output a low voltage level indicating the value of the data stored in the memory cell to be "1". The voltage level outputted by the sensing amplifier will be stored by a latch for later access.

However, transistors of different sensing amplifiers may have different threshold voltages due to characteristic variation caused during the manufacturing process; therefore, the sensing time required by different sensing amplifiers for outputting the valid voltage level will also be different. To ensure the latches can store the valid data generated by different sensing amplifiers, a long fixed delay time is required for all sensing amplifiers to keep sensing valid data output before the latches are closed. Consequently, the sensing time is not optimized, and the power is wasted in prior art. On the other hand, the sensing time is hard to be predicted at low voltage, while the fixed delay time may not be long enough to output valid data.

SUMMARY OF THE INVENTION

One embodiment of the present invention discloses a sensing amplification circuit. The sensing amplification circuit includes a sensing amplifier, and a trigger control circuit.

The sensing amplifier receives a data voltage and a reference voltage, and outputs a first data signal and a second data signal by comparing the data voltage and the reference voltage. The first data signal and the second data signal become complementary after the sensing amplifier is enabled, and the first data signal and the second data signal are at a same state when the sensing amplifier is disabled.

The trigger control circuit includes a logic circuit and a set-reset latch. The logic circuit is coupled to the sensing amplifier, and receives the first data signal and the second data signal. The logic circuit changes a first control signal from a first voltage level to a second voltage level when the state of either the first data signal or the second data signal changes. The set-reset latch is coupled to the sensing amplifier and the logic circuit. The set-reset latch receives the first control signal and a second control signal, and generates a trigger signal to enable the sensing amplifier when the second control signal changes from the first voltage level to the second voltage level and disable the sensing amplifier when the first control signal changes from the first voltage level to the second voltage level.

Another embodiment of the present invention discloses a method for operating a sensing amplification circuit. The sensing amplification circuit includes a sensing amplifier and a trigger control circuit.

The method includes the trigger control circuit changing a trigger signal from a first voltage level to a second voltage level to enable the sensing amplifier, the sensing amplifier outputting a first data signal and a second data signal complementary to the first data signal by comparing a data voltage and a reference voltage when the sensing amplifier is enabled, and the trigger control circuit changing the trigger signal from the second voltage level to the first voltage level to disable the sensing amplifier when one of the first data signal and the second data signal changes its state. The first data signal and the second data signal are at a same state when the sensing amplifier is disabled.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
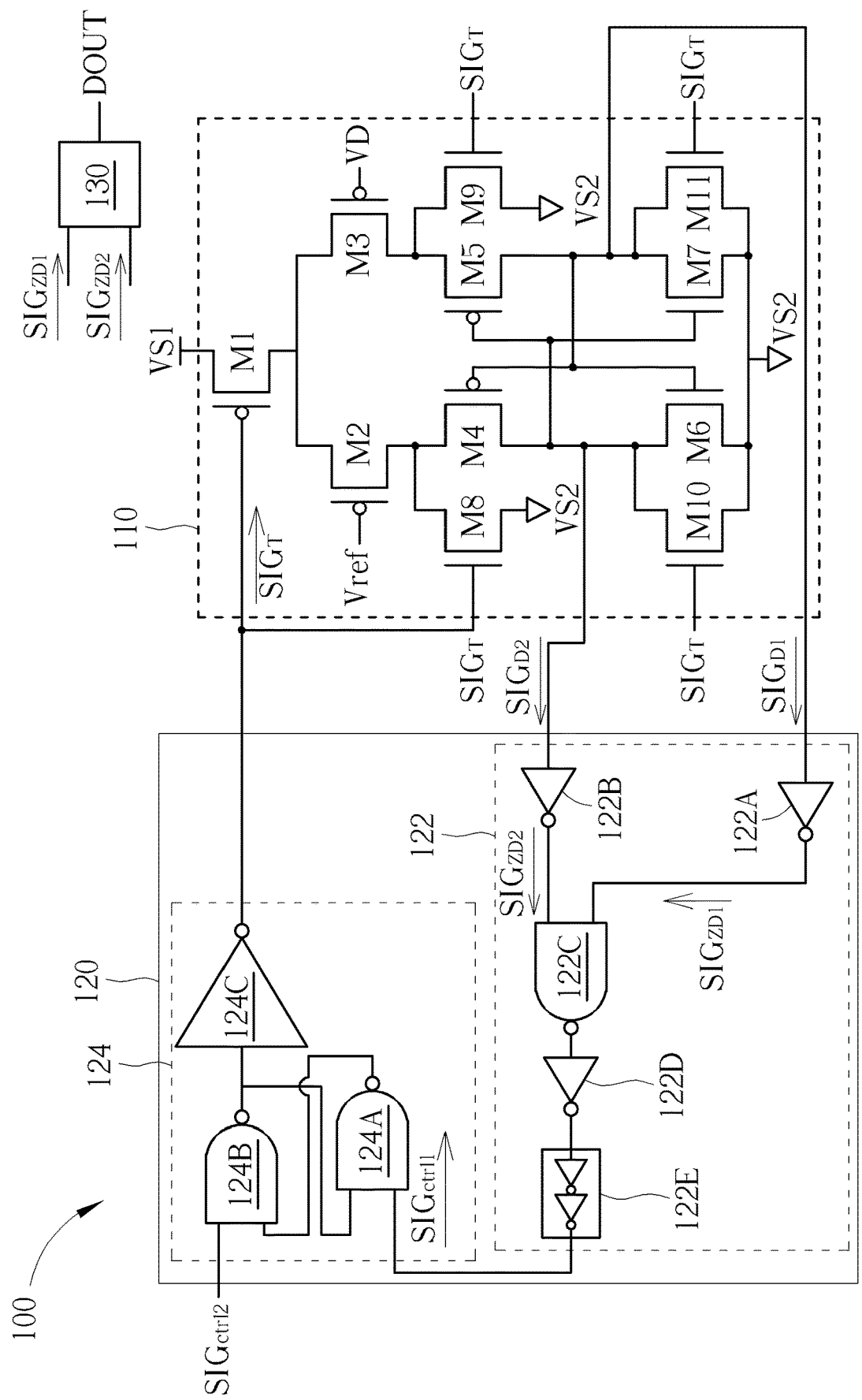
FIG. 1 shows a sensing amplification circuit according to one embodiment of the present invention.

FIG. 1 shows a sensing amplification circuit 100 according to one embodiment of the present invention. The sensing amplification circuit 100 includes a sensing amplifier 110 and a trigger control circuit 120.

The sensing amplifier 110 can receive a data voltage VD and a reference voltage Vref. In some embodiments, the data voltage VD can be generated by a memory cell to be read, and the sensing amplifier 110 can receive the data voltage VD through a bit line coupled to the memory cell. The reference voltage Vref can be used to determine the data value represented by the data voltage VD, that is, the data stored in the memory cell.

For example, if the data voltage VD is higher than the reference voltage Vref, then the sensing amplifier 110 may output a data signal $SIG_{D1}$ at a low voltage to indicate the value of the data stored in the memory cell to be, for example but not limited to "1". Otherwise, if the data voltage VD is lower than the reference voltage Vref, then the sensing amplifier 110 will output the data signal $SIG_{D1}$ at a high voltage to indicate the value of the data stored in the memory cell to be, for example but not limited to "0".

That is, the sensing amplifier 110 can output the data signal $SIG_{D1}$ to indicate the data value by comparing the data voltage VD and the reference voltage Vref. Furthermore, in FIG. 1, the sensing amplifier 110 can also output a data signal $SIG_{D2}$ to indicate the complementary data value. Also, in FIG. 1, the sensing amplification circuit 100 can further include a set-reset latch 130. The set-reset latch 130 can store and output the read data DOUT according to the first data signal $SIG_{D1}$ and the second data signal $SIG_{D2}$.

In some embodiments, when the sensing amplifier 110 is disabled, the first data signal $SIG_{D1}$ and the second data signal $SIG_{D2}$ would be at the same state, and when the sensing amplifier 110 is enabled, the sensing amplifier 110 will start to sense the data voltage VD and the reference voltage Vref, and output the first data signal $SIG_{D1}$ and the second data signal $SIG_{D2}$ accordingly. In some embodiments, the comparison result can be determined when the inverted data signals $SIG_{ZD1}$ and $SIG_{ZD2}$ become complementary.

In this case, the first control signal $SIG_{ctrl1}$ will change its state according to the change of the inverted data signal $SIG_{ZD1}$ or $SIG_{ZD2}$, and the trigger control circuit 120 can sense the change of the first control signal $SIG_{ctrl1}$ and switch the state of a trigger signal $SIG_T$ for disabling the sensing amplifier 110. Therefore, the sensing amplifier 110 can be disabled right after the comparison result has been determined. Consequently, the reading time can be reduced, and the power efficiency can be improved.

In FIG. 1, the trigger control circuit 120 includes a logic circuit 122 and a set-reset latch 124. The logic circuit 122 is coupled to the sensing amplifier 110, and the first set-reset latch 124 is coupled to the sensing amplifier 110 and the logic circuit 122. The logic circuit 122 can receive the first data signal $SIG_{D1}$ and the second data signal $SIG_{D2}$, and generate a first control signal $SIG_{ctrl1}$ according to the first data signal $SIG_{D1}$ and the second data signal $SIG_{D2}$. The set-reset latch 124 can receive the first control signal $SIG_{ctrl1}$ and a second control signal $SIG_{ctrl2}$, and generate the trigger signal $SIG_T$ to enable or disable the sensing amplifier 110 according to the first control signal $SIG_{ctrl1}$ and the second control signal $SIG_{ctrl2}$. In some embodiments, the second control signal $SIG_{ctrl2}$ may be a sensing enable signal issued by the system and can be a pulse signal generated by an external pulse generator.

In the present embodiment, the logic circuit 122 can include a first inverter 122A, a second inverter 122B, a NAND gate 122C, and a third inverter 122D. The first inverter 122A has an input terminal for receiving the first data signal $SIG_{D1}$, and an output terminal. The second inverter 122B has an input terminal for receiving the second data signal $SIG_{D2}$, and an output terminal. The NAND gate 122C has a first input terminal coupled to the output terminal of the first inverter 122A, a second input terminal coupled to the output terminal of the second inverter 122B, and an output terminal. The third inverter 122D has an input terminal coupled to the output terminal of the NAND gate 122C, and an output terminal for outputting the first control signal $SIG_{ctrl1}$.

The set-reset latch 124 can include a first NAND gate 124A, a second NAND gate 124B, and an inverter 124C. The first NAND gate 124A has a first input terminal for receiving the first control signal $SIG_{ctrl1}$, a second input terminal, and an output terminal. The second NAND gate 124B has a first input terminal coupled to the output terminal of the first NAND gate 124A, a second input terminal for receive the second control signal $SIG_{ctrl2}$, and an output terminal coupled to the second input terminal of the first NAND gate 124A. The inverter 124C has an input terminal coupled to the output terminal of the second NAND gate 124B, and an output terminal for outputting the trigger signal $SIG_T$.

Figure 2:
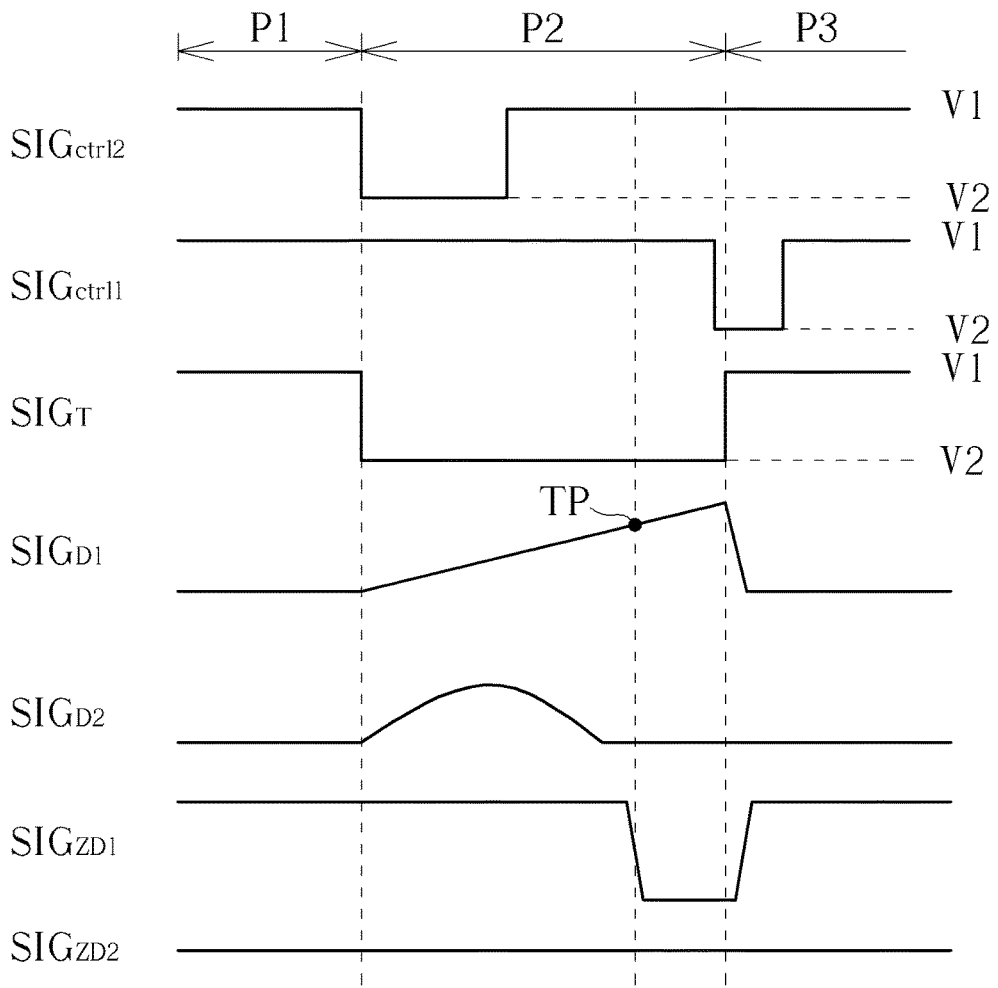
FIG. 2 shows a timing diagram of the sensing amplification circuit in FIG. 1 according to one embodiment of the present invention.

FIG. 2 shows a timing diagram of the sensing amplification circuit 100 according to one embodiment of the present invention. In FIG. 2, during the period P1, the sensing amplification circuit 100 is in an idle mode or a standby mode. In this case, the sensing amplifier 110 is disabled, and the first data signal $SIG_{D1}$ and the second data signal $SIG_{D2}$ are at the same state. For example, in FIG. 2, the first data signal $SIG_{D1}$ and the second data signal $SIG_{D2}$ can both be at a low voltage. Therefore, the first control signal $SIG_{ctrl1}$ generated by the logic circuit 122 would be at a voltage level V1. Also, the second control signal $SIG_{ctrl2}$ is at the voltage level V1. Consequently, the trigger signal $SIG_T$ generated by the set-reset latch 124 will remain at the previous state, which would be the voltage level V1 in the present embodiment as shown in FIG. 2.

During the period P2, the second control signal $SIG_{ctrl2}$ is pulled down from the first voltage level V1 to the second voltage level V2 for enabling the sensing amplifier 110. In this case, the set-reset latch 124 will change the trigger signal $SIG_T$ from the first voltage level V1 to the second voltage level V2. In the present embodiment, the sensing amplifier 110 would be triggered when the trigger signal $SIG_T$ is pulled down.

In FIG. 2, the second control signal $SIG_{ctrl2}$ is a pulse signal, and will be changed back from the second voltage level V2 to the first voltage level V1 during the period P2. However, the trigger signal $SIG_T$ generated by the set-reset latch 124 will remain at the previous state. That is, the trigger signal $SIG_T$ will remain at the second voltage level V2, and the sensing amplifier 110 will keep sensing the data voltage VD and the reference voltage Vref during the period P2. Therefore, during the period P2, the first data signal $SIG_{D1}$ and the second data signal $SIG_{D2}$ may vary as the comparison process performs, and when one of the first data signal $SIG_{D1}$ and the second data signal $SIG_{D2}$ reaches the trip point TP, the inverted data signals $SIG_{ZD1}$ and $SIG_{ZD2}$ will start settling at two complementary states. For example, in FIG. 2, the inverted data signal $SIG_{ZD1}$ is settled at a low voltage at the end of the period P2 while the inverted data signal $SIG_{ZD2}$ is settled at a high voltage according to the compassion result.

Once the inverted data signals $SIG_{ZD1}$ and $SIG_{ZD2}$ are settled at two complementary states, the logic circuit 122 will change the first control signal $SIG_{ctrl1}$ from the first voltage level V1 to the second voltage level V2. Correspondingly, the set-reset latch 124 will change the trigger signal $SIG_T$ from the second voltage level V2 to the first voltage level V1, which also ends the second period P2 and starts the period P3, and the sensing amplifier 110 will be disabled during the period P3.

During the period P3, since the sensing amplifier 110 is disabled, the first data signal $SIG_{D1}$ and the second data signal $SIG_{D2}$ will become the same state eventually. Therefore, the first control signal $SIG_{ctrl1}$ generated by the logic circuit 122 would be changed back to the voltage level V1 in the end of the period P3, and the sensing amplification circuit 100 would be back to the idle mode or the standby mode.

Consequently, with the trigger control circuit 120, once the sensing amplifier 110 is enabled, the sensing amplification circuit 100 will disable the sensing amplifier 110 automatically when the sensing amplifier 110 finishes the comparison. That is, the sensing amplification circuit 100 can be self-tracking and provide the optimum sensing time.

In some embodiments, to ensure that the set-reset latch 130 can store the valid data by the end of the period P2 in time, the logic circuit 122 can further includes at least one delay element 122E coupled to the output terminal of the third inverter 122D. The delay element 122E can delay the first control signal $SIG_{ctrl1}$, so the trigger signal $SIG_T$ will be changed to the first voltage level V1 slower for extending the length of the period P2 and allowing the set-reset latch 130 to store the valid data with sufficient time. In FIG. 1, the delay element 122E can be implemented by two cascade inverters; however, in some other embodiments, the delay element 122E may be implemented with other elements and/or with other structures. Furthermore, in some embodiments, if the set-reset latch 130 can store the valid data soon enough, then the delay element 122E may be omitted.

In FIG. 1, the sensing amplifier 110 includes transistors M1 to M7. The first transistor M1 has a first terminal for receiving a first system voltage VS1, a second terminal, and a control terminal coupled to the set-reset latch 124 for receiving the trigger signal $SIG_T$. The second transistor M2 has a first terminal coupled to the second terminal of the first transistor M1, a second terminal, and a control terminal for receiving the reference voltage Vref. The third transistor M3 has a first terminal coupled to the second terminal of the first transistor M1, a second terminal, and a control terminal for receiving the data voltage VD. The fourth transistor M4 has a first terminal coupled to the second terminal of the second transistor M2, a second terminal for outputting the second data signal $SIG_{D2}$, and a control terminal. The fifth transistor M5 has a first terminal coupled to the second terminal of the third transistor M3, a second terminal coupled to the control terminal of the fourth transistor M4 and for outputting the first data signal $SIG_{D1}$, and a control terminal coupled to the second terminal of the fourth transistor M4. The sixth transistor M6 has a first terminal coupled to the second terminal of the fourth transistor M4, a second terminal for receiving a second system voltage VS2, and a control terminal coupled to the control terminal of the fourth transistor M4. The seventh transistor M7 has a first terminal coupled to the second terminal of the fifth transistor M5, a second terminal for receiving the second system voltage VS2, and a control terminal coupled to the control terminal of the fifth transistor M5. In some embodiments, the first system voltage VS1 can be higher than the second system voltage VS2. For example, the first system voltage VS1 can be the high operation voltage of the system, and the second voltage VS2 can be the ground voltage of the system.

In addition, the first transistor M1, the second transistor M2, the third transistor M3, the fourth transistor M4, and the fifth transistor M5 can be P-type transistors. Also, the sixth transistor M6 and the seventh transistor M7 can be N-type transistors. In this case, when the trigger signal $SIG_T$ changes from the first voltage level V1 to the second voltage level V2 shown in FIG. 2, the first transistor M1 will be turned on, and the sensing amplifier 110 will be enabled to sense the data voltage VD and the reference voltage Vref.

During the period P2 shown in FIG. 2, the transistors M2, M3, M4, M5, M6 and M7 can output the first data signal $SIG_{D1}$ and the second data signal $SIG_{D2}$ according to the relation between the data voltage VD and the reference voltage Vref. For example, if the data voltage VD is lower than the reference voltage Vref, then the current generated by the third transistor M3 will be greater than the current generated by the second transistor M2. Consequently, the fifth transistor M5 will be turned on, and the first data signal $SIG_{D1}$ will be raised to a voltage level close to the first system voltage VS1. Also, the raised first data signal $SIG_{D1}$ will turn off the fourth transistor M4 and turn on the sixth transistor M6, so the second data signal $SIG_{D2}$ will be pulled down to a voltage level close to the second system voltage VS2. In FIG. 2, before the third transistor M3 dominates the result, the second transistor M2 may also be turned on for a short while, so the voltage of the second data signal $SIG_{D2}$ may be raised in the beginning, and will be pulled down eventually.

The opposite operations will occur if the data voltage VD is greater than the reference voltage Vref, and in that case, the first data signal $SIG_{D1}$ will be pulled down and the second data signal $SIG_{D2}$ will be raised by the end of the comparison process.

Furthermore, to ensure the first data signal $SIG_{D1}$ and the data signal $SIG_{D2}$ to be at the same state when the sensing amplifier 110 is disabled, for example, to control the first data signal $SIG_{D1}$ and the data signal $SIG_{D2}$ to be at the low voltage, the sensing amplifier 110 can further include transistor M8, M9, M10, and M11.

In FIG. 1, the eighth transistor M8 has a first terminal coupled to the second terminal of the second transistor M2, a second terminal for receiving the second system voltage VS2, and a control terminal for receiving the trigger signal $SIG_T$. The ninth transistor M9 has a first terminal coupled to the second terminal of the third transistor M3, a second terminal for receiving the second system voltage VS2, and a control terminal for receiving the trigger signal $SIG_T$. The tenth transistor M10 has a first terminal coupled to the second terminal of the fourth transistor M4, a second terminal for receiving the second system voltage VS2, and a control terminal for receiving the trigger signal $SIG_T$. The eleventh transistor M11 has a first terminal coupled to the second terminal of the fifth transistor M5, a second terminal for receiving the second system voltage VS2, and a control terminal for receiving the trigger signal $SIG_T$. Also, the eighth transistor M8, the ninth transistor M9, the tenth transistor M10, and the eleventh transistor M11 can be N-type transistors.

In this case, when the trigger signal $SIG_T$ is at the first voltage level V1 for disabling the sensing amplifier 110, the transistor M8, M9, M10 and M11 will be turned on, pulling down the voltages of the first data signal $SIG_{D1}$ and the second data signal $SIG_{D2}$. However, when the trigger signal $SIG_T$ is at the second voltage level V2 for enabling the sensing amplifier 110, the transistor M8, M9, M10 and M11 will be turned off.

In some embodiments, the set-reset latches 124 and 130 can have the same structure, and can have the same behavior when the same input signals are applied. In this case, the set-reset latch 130 may receive the inverted data signals $SIG_{ZD1}$ and $SIG_{ZD2}$ for the storing operations. Since the trigger control circuit 120 can delay the state change of the trigger signal $SIG_T$ according to the inverted data signals $SIG_{ZD1}$ and $SIG_{ZD2}$ with the internal gates, the set-reset latch 130 is able to store the valid read data DOUT before the trigger control circuit 120 disables the sensing amplifier 110 with the trigger signal $SIG_T$.

Therefore, in some embodiments, the set-reset latch 130 may be coupled to the inverters 122A and 122B for receiving the inverted data signals $SIG_{ZD1}$ and $SIG_{ZD2}$.

Since the trigger control circuit 120 can detect the timing when the sensing amplifier 110 finishes the comparison, the trigger control circuit 120 can disable the sensing amplifier 110 at the optimum timing. Therefore, the data reading time can be reduced, and the reading power can be saved. Furthermore, since the sensing amplification circuit 100 can be self-tracking, the threshold voltage variation between transistors of different sensing amplification circuits will no longer become an issue when determining the sensing time.

However, in some other embodiments, the set-reset latch 130 may be implemented with some other elements, for example but not limited to, replacing the NAND gates with NOR gates. In this case, the set-reset latch 130 may have opposite input/output behavior from the set-reset latch 124, and thus, the set-reset latch 130 may receive the first data signal $SIG_{D1}$ and the second data signal $SIG_{D2}$ directly. Also, in some embodiments, the set-reset latch 124 can also be implemented with different structures and/or different elements. In that case, the sensing amplifier 110 may be redesigned to be enabled or disabled by different voltage levels according to the trigger signal $SIG_T$ generated by the trigger control circuit 120. That is, the set-reset latches 124 and 130, and the logic circuit 122 shown in FIG. 1 are not to limit the scope of the present invention. In some other embodiments, the set-reset latches 124 and 130, and the logic circuit 122 may be implemented with other structures and/or with other elements, including known circuits and unknown circuits that can fulfill the same function.

Figure 3:
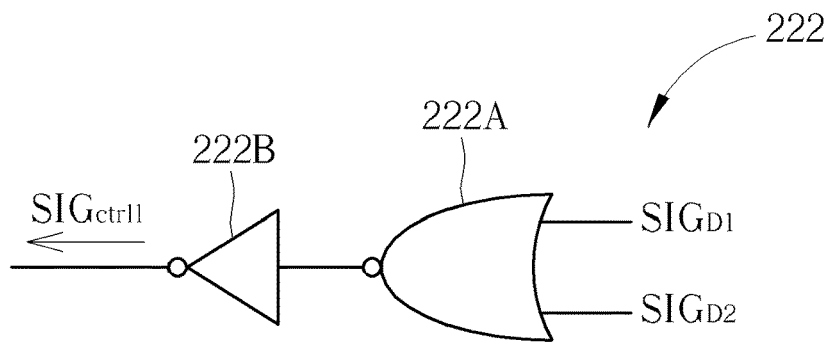
FIG. 3 shows a logic circuit according to one embodiment of the present invention.

FIG. 3 shows a logic circuit 222 according to one embodiment of the present invention. The logic circuit 222 include an OR gate 222A and an inverter 222B.

The logic circuit 222 can be applied in the sensing amplification circuit 100 and replace the logic circuit 122. In this case, the OR gate 222A has a first input terminal for receiving the first data signal $SIG_{D1}$, a second input terminal for receiving the second data signal $SIG_{D2}$, and an output terminal. The inverter 222B has an input terminal coupled to the output terminal of the OR gate 222A, and an output terminal for outputting the first control signal $SIG_{ctrl1}$.

Figure 4:
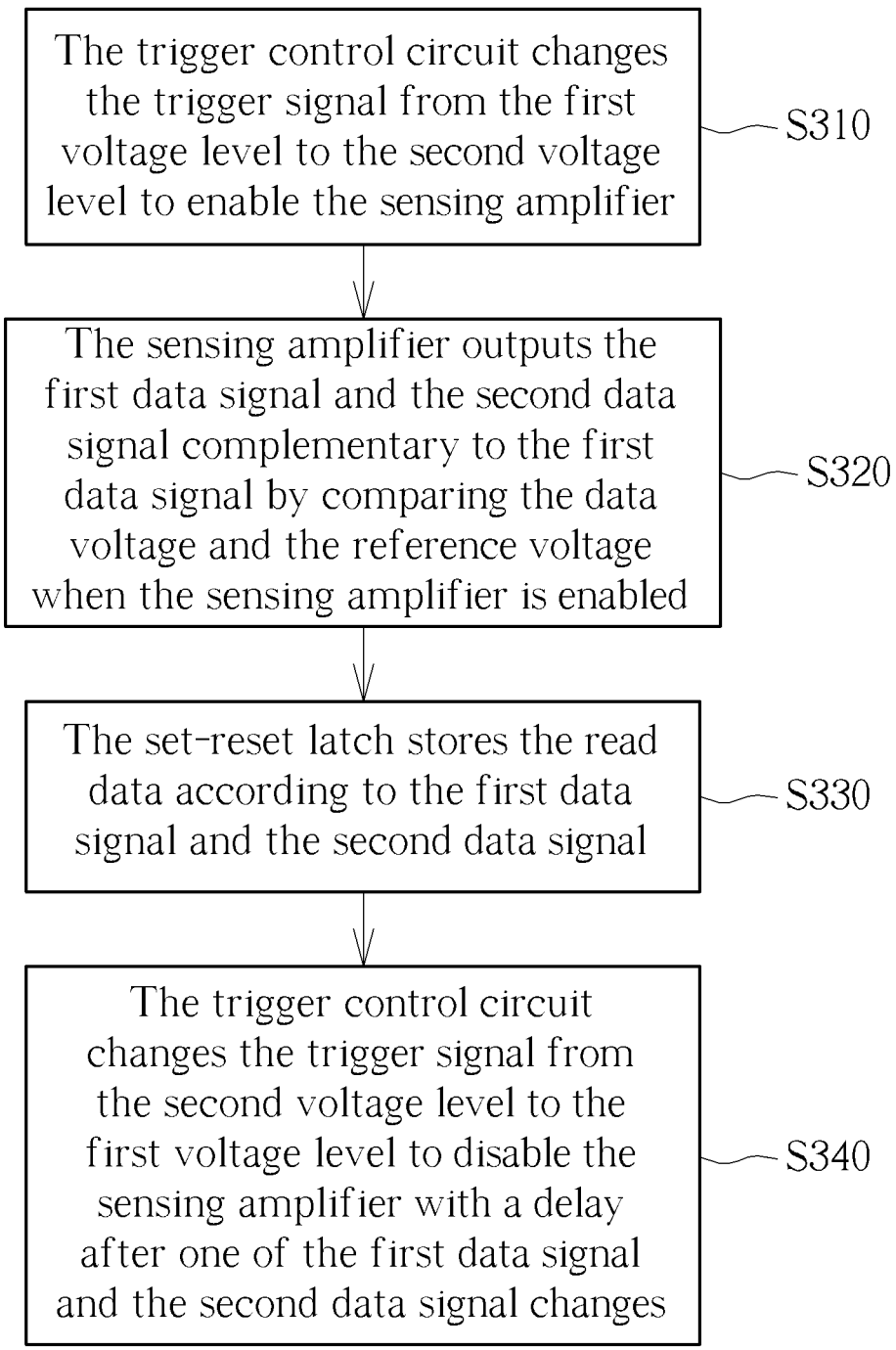
FIG. 4 shows a method for operating the sensing amplification circuit in FIG. 1 according to one embodiment of the present invention.

FIG. 4 shows a method 300 for operating the sensing amplification circuit 100 according to one embodiment of the present invention. The method 300 includes step S310 to S340.

S310: the trigger control circuit 120 changes the trigger signal $SIG_T$ from the first voltage level V1 to the second voltage level V2 to enable the sensing amplifier 110;

S320: the sensing amplifier 110 outputs the first data signal $SIG_{D1}$ and the second data signal $SIG_{D2}$ complementary to the first data signal $SIG_{D1}$ by comparing the data voltage VD and the reference voltage Vref when the sensing amplifier 110 is enabled;

S330: the set-reset latch 130 stores the read data according to the first data signal $SIG_{D1}$ and the second data signal $SIG_{D2}$;

S340: the trigger control circuit 120 changes the trigger signal $SIG_T$ from the second voltage level V2 to the first voltage level V1 to disable the sensing amplifier 110 with a delay after one of the first data signal $SIG_{D1}$ and the second data signal $SIG_{D2}$ changes its state.

With the method 300, after the trigger control circuit 120 enable the sensing amplifier 110 in step S310, the sensing amplifier 110 will output the first data signal $SIG_{D1}$ and the second data signal $SIG_{D2}$ in step S320. The read data can be stored by the set-reset latch 130 according to the complementary data signals $SIG_{D1}$ and $SIG_{D2}$ in step S330. Also, after the data signal $SIG_{D1}$ or $SIG_{D2}$ reaches the trip point TP as shown in FIG. 2, the inverted data signals $SIG_{ZD1}$ and $SIG_{ZD2}$ will become complementary, causing the trigger control circuit 120 to change the state of the trigger signal $SIG_T$ for disabling the sensing amplifier 110. Since the internal gates of the trigger control circuit 120 (such as the NAND gates 122C, 124A, and 124B, and the inverter 124C) will cause delays when generating the trigger signal $SIG_T$, the trigger control circuit 120 will change the state of the trigger signal $SIG_T$ after the data value becomes valid and is stored by the set-reset latch 130. Consequently, the trigger control circuit 120 can disable the sensing amplifier 110 at the optimum timing after the valid data has been stored while the data reading time can be reduced and the reading power can be saved.

In summary, the sensing amplification circuits and the methods for operating the sensing amplification circuit provided by the embodiment of the present invention allows the sensing amplification circuit to be self-tracking and provide the optimum reading time. Therefore, the power consumption can be reduced, and the issue caused by threshold voltage variation between transistors of different sensing amplification circuits when determining the sensing time individually can be solved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sensing amplification circuit, comprising:
   a sensing amplifier configured to receive a data voltage and a reference voltage, and output a first data signal and a second data signal by comparing the data voltage and the reference voltage, wherein the first data signal and the second data signal become complementary after the sensing amplifier is enabled, and the first data signal and the second data signal are at a same state when the sensing amplifier is disabled; and
   a trigger control circuit comprising:
      a logic circuit coupled to the sensing amplifier, and configured to receive the first data signal and the second data signal, and change a first control signal from a first voltage level to a second voltage level when one of the first data signal and the second data signal changes its state; and
      a first set-reset latch coupled to the sensing amplifier and the logic circuit, and configured to receive the first control signal and a second control signal, and generate a trigger signal to enable the sensing amplifier when the second control signal changes from the first voltage level to the second voltage level and disable the sensing amplifier when the first control signal changes from the first voltage level to the second voltage level.

2. The sensing amplification circuit of claim 1, further comprising:
   a second set-reset latch configured to store and output read data according to the first data signal and the second data signal.

3. The sensing amplification circuit of claim 1, wherein the sensing amplifier comprises:
   a first transistor having a first terminal configured to receive a first system voltage, a second terminal, and a control terminal coupled to the first set-reset latch for receiving the trigger signal;
   a second transistor having a first terminal coupled to the second terminal of the first transistor, a second terminal, and a control terminal configured to receive the reference voltage;
   a third transistor having a first terminal coupled to the second terminal of the first transistor, a second terminal, and a control terminal configured to receive the data voltage;

a fourth transistor having a first terminal coupled to the second terminal of the second transistor, a second terminal configured to output the second data signal, and a control terminal;

a fifth transistor having a first terminal coupled to the second terminal of the third transistor, a second terminal coupled to the control terminal of the fourth transistor and configured to output the first data signal, and a control terminal coupled to the second terminal of the fourth transistor;

a sixth transistor having a first terminal coupled to the second terminal of the fourth transistor, a second terminal configured to receive a second system voltage, and a control terminal coupled to the control terminal of the fourth transistor; and a seventh transistor having a first terminal coupled to the second terminal of the fifth transistor, a second terminal configured to receive the second system voltage, and a control terminal coupled to the control terminal of the fifth transistor.

4. The sensing amplification circuit of claim 3, wherein the sensing amplifier further comprises:

an eighth transistor having a first terminal coupled to the second terminal of the second transistor, a second terminal configured to receive the second system voltage, and a control terminal configured to receive the trigger signal;

a ninth transistor having a first terminal coupled to the second terminal of the third transistor, a second terminal configured to receive the second system voltage, and a control terminal configured to receive the trigger signal;

a tenth transistor having a first terminal coupled to the second terminal of the fourth transistor, a second terminal configured to receive the second system voltage, and a control terminal configured to receive the trigger signal; and an eleventh transistor having a first terminal coupled to the second terminal of the fifth transistor, a second terminal configured to receive the second system voltage, and a control terminal configured to receive the trigger signal.

5. The sensing amplification circuit of claim 4, wherein:
the first transistor, the second transistor, the third transistor, the fourth transistor, and the fifth transistor are P-type transistors; and
the sixth transistor, the seventh transistor, the eighth transistor, the ninth transistor, the tenth transistor, and the eleventh transistor are N-type transistors.

6. The sensing amplification circuit of claim 5, wherein the first voltage level is higher than the second voltage level, and the first system voltage is higher than the second system voltage.

7. The sensing amplification circuit of claim 1, wherein the logic circuit is further configured to change the state of the first control signal from the second voltage level to the first second voltage level when the first data signal and the second data signal are at the same state when the sensing amplifier is disabled.

8. The sensing amplification circuit of claim 1, wherein the logic circuit comprises:

a first inverter having an input terminal configured to receive the first data signal, and an output terminal;

a second inverter having an input terminal configured to receive the second data signal, and an output terminal;

a NAND gate having a first input terminal coupled to the output terminal of the first inverter, a second input terminal coupled to the output terminal of the second inverter, and an output terminal; and a third inverter having an input terminal coupled to the output terminal of the NAND gate, and an output terminal configured to output the first control signal.

9. The sensing amplification circuit of claim 8, wherein the logic circuit further comprises at least one delay element coupled to the output terminal of the third inverter, and configured to delay the first control signal.

10. The sensing amplification circuit of claim 1, wherein the logic circuit comprises:

an OR gate having a first input terminal configured to receive the first data signal, a second input terminal configured to receive the second data signal, and an output terminal; and an inverter having an input terminal coupled to the output terminal of the OR gate, and an output terminal configured to output the first control signal.

11. The sensing amplification circuit of claim 1, wherein the first set-reset latch comprises:

a first NAND gate having a first input terminal configured to receive the first control signal, a second input terminal, and an output terminal;

a second NAND gate having a first input terminal coupled to the output terminal of the first NAND gate, a second input terminal configured to receive the second control signal, and an output terminal coupled to the second input terminal of the first NAND gate; and an inverter having an input terminal coupled to the output terminal of the second NAND gate, and an output terminal configured to output the trigger signal.

12. The sensing amplification circuit of claim 1, wherein the second control signal is a pulse signal generated by an external pulse generator.

13. A method for operating a sensing amplification circuit, the sensing amplification circuit comprising a sensing amplifier and a trigger control circuit, the method comprising:

the trigger control circuit changing a trigger signal from a first voltage level to a second voltage level to enable the sensing amplifier;

the sensing amplifier outputting a first data signal and a second data signal complementary to the first data signal by comparing a data voltage and a reference voltage when the sensing amplifier is enabled; and the trigger control circuit changing the trigger signal from the second voltage level to the first voltage level to disable the sensing amplifier after one of the first data signal and the second data signal changes its state;

wherein the first data signal and the second data signal are at a same state when the sensing amplifier is disabled.

14. The method of claim 13, wherein the sensing amplification circuit further comprises a set-reset latch, and the method further comprises:

the set-reset latch storing read data according to the first data signal and the second data signal.

* * * * *